United States Patent
Mazumder

(10) Patent No.: US 10,063,234 B1
(45) Date of Patent: Aug. 28, 2018

(54) HALF-FREQUENCY COMMAND PATH

(71) Applicant: MICRON TECHNOLOGY, INC., Boise, ID (US)

(72) Inventor: Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/649,145

(22) Filed: Jul. 13, 2017

(51) Int. Cl.
 *H03K 21/00* (2006.01)
 *H03K 19/0175* (2006.01)
 *G11C 11/4076* (2006.01)
 *H03K 3/037* (2006.01)

(52) U.S. Cl.
 CPC .. *H03K 19/017509* (2013.01); *G11C 11/4076* (2013.01); *H03K 3/037* (2013.01)

(58) Field of Classification Search
 CPC ........... H03K 19/017509; H03K 3/037; H03K 21/00; G11C 11/4076
 See application file for complete search history.

(56) References Cited

U.S. PATENT DOCUMENTS

| | | | | |
|---|---|---|---|---|
| 5,341,249 A * | 8/1994 | Abbott | ................... | G11B 20/10 360/39 |
| 8,169,851 B2 * | 5/2012 | Chou | ..................... | G11C 7/222 365/233.11 |
| 2001/0028599 A1 * | 10/2001 | Aikawa | ................ | G11C 7/1066 365/233.12 |
| 2007/0147166 A1 * | 6/2007 | Lee | ....................... | G11C 7/1012 365/189.15 |
| 2008/0219399 A1 * | 9/2008 | Nary | ...................... | H03K 21/10 377/47 |
| 2009/0016146 A1 * | 1/2009 | Fujisawa | .................. | G11C 7/22 365/233.1 |
| 2011/0235459 A1 * | 9/2011 | Ware | ........................ | G11C 7/04 365/233.11 |
| 2017/0077918 A1 * | 3/2017 | Agrawal | .................. | H03K 7/06 |

* cited by examiner

*Primary Examiner* — Jason M Crawford
(74) *Attorney, Agent, or Firm* — Fletcher Yoder, P.C.

(57) ABSTRACT

A semiconductor device includes a clock divider that receives a clock signal and generates even and odd clock signals. The clock signal includes a first frequency, while the even and odd clock signals each includes a second frequency that is half the first frequency. The semiconductor device also includes even and odd command paths coupled to the clock divider each having a set of logic and a set of flip-flops. The even command path receives a command and the even clock signal and outputs an even output signal. The odd command path receives the command and the odd clock signal and outputs an odd output signal. The semiconductor device also includes combination circuitry coupled to the even and odd command paths that combines the even and odd output signals.

16 Claims, 7 Drawing Sheets

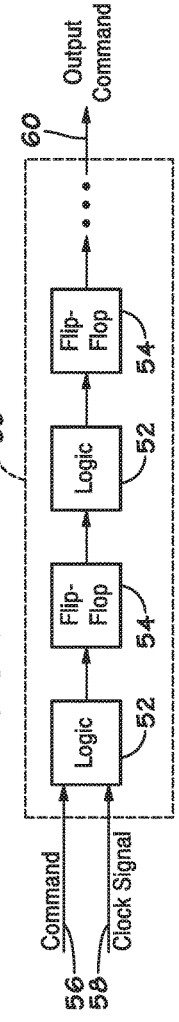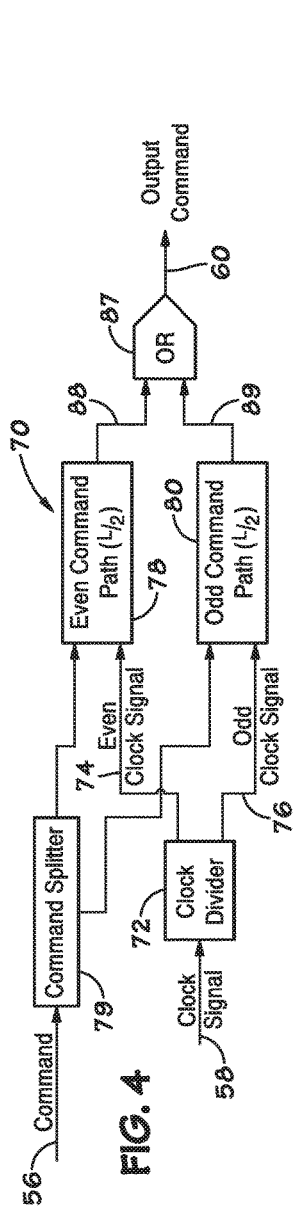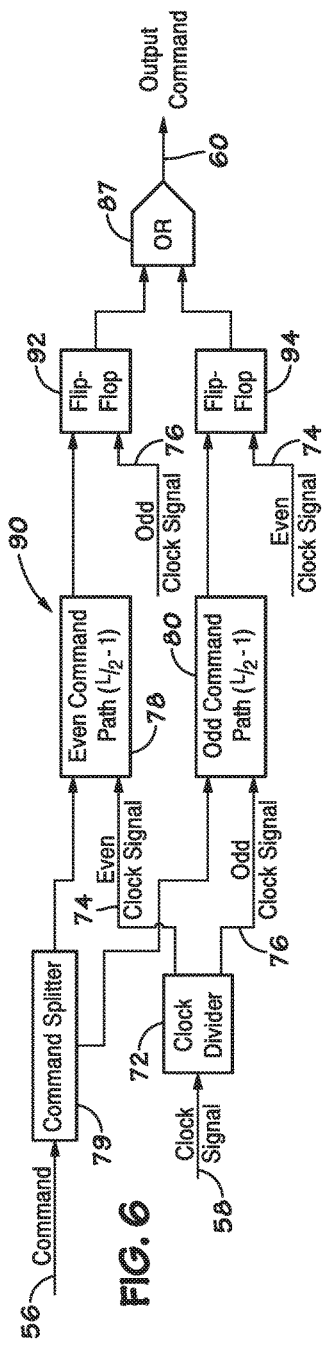

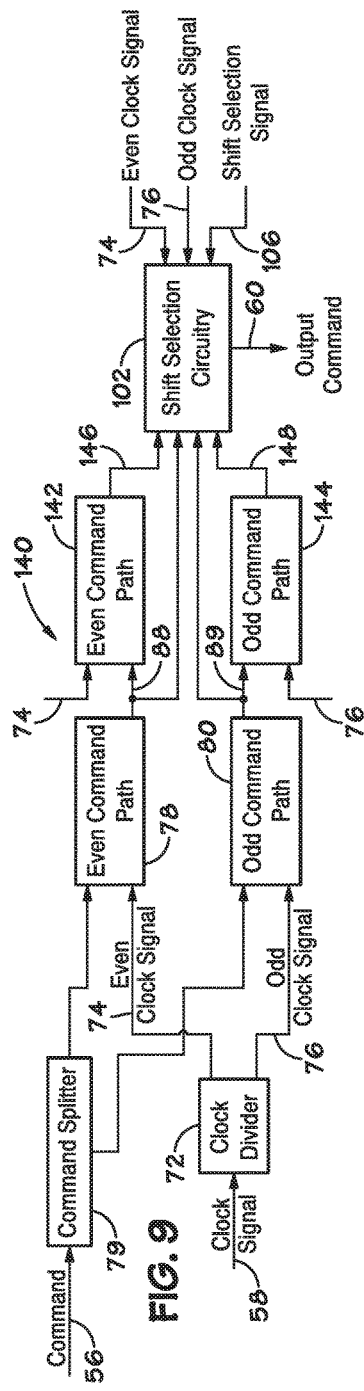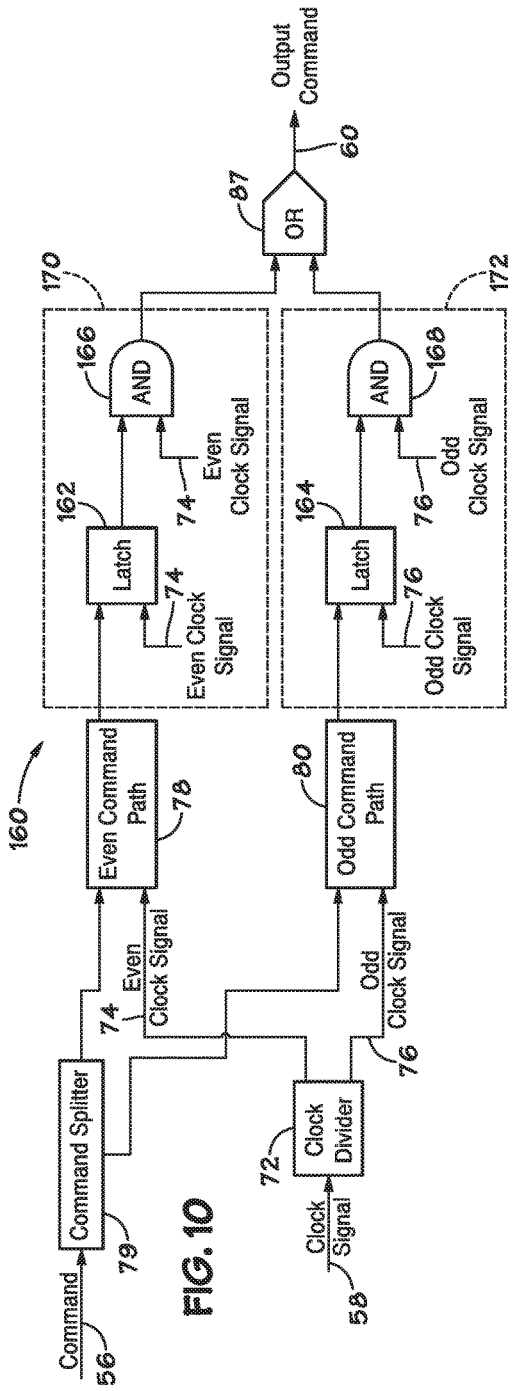

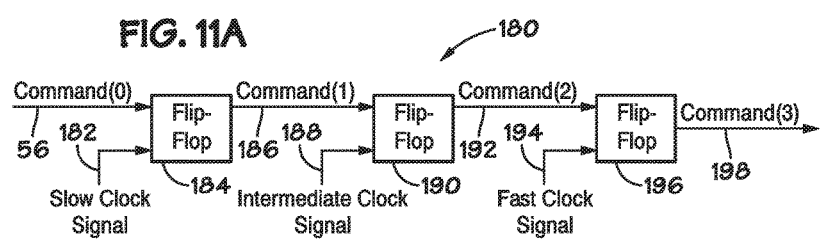
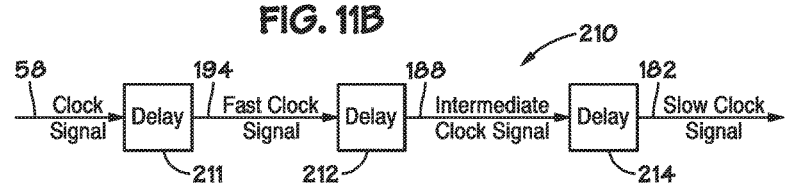
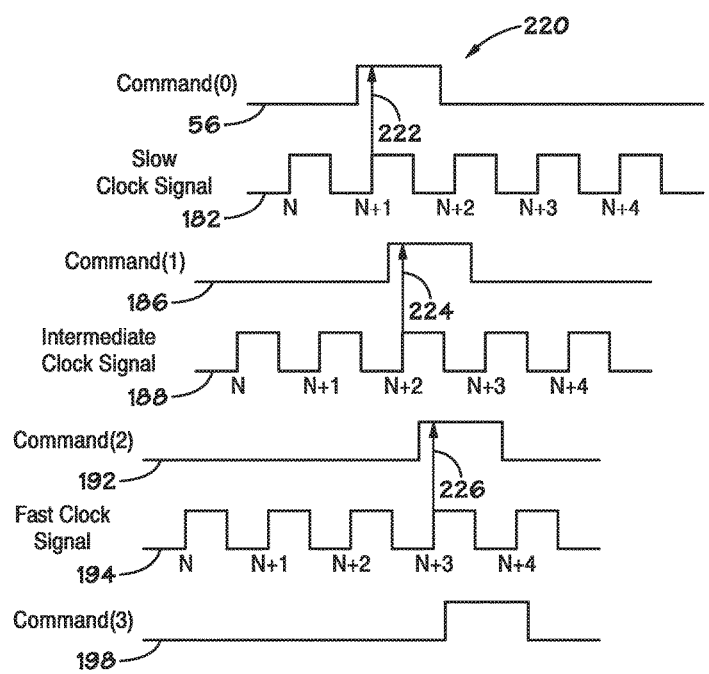

HALF-FREQUENCY COMMAND PATH

BACKGROUND

Field of the Present Disclosure

Embodiments of the present disclosure relate generally to the field of semiconductor devices. More specifically, embodiments of the present disclosure relate to command paths of a semiconductor device.

Description of Related Art

A semiconductor device, such as a microcomputer, memory, gate array, among others, may include command paths to transmit commands from a command source, such as an input pin, register, controller, and the like, to logic in the semiconductor device configured to implement the command. The command paths may include logic and flip-flops that may be used in the semiconductor device to facilitate implementing the command. For example, the logic (which may include a combination of different kinds of logic) may perform programmed instructions on or based on signals in the semiconductor device. The flip-flops may shift the signals in the semiconductor device to, for example, resolve latency issues resulting from transmitting and/or receiving the signals in the semiconductor device.

For each flip-flop used in a command path, there is an associated overhead time used to receive and send the command. The remaining time (e.g., in a period of an associated clock signal) may be used to perform the logic functions programmed into the logic. As such, in cases where the associated clock signal is sufficiently fast, the remaining time may not be sufficient enough to perform the logic functions programmed into the logic, resulting in break down of the command path.

The flip-flops in the command path typically operate at the frequency of the associated clock signal. However, in some instances, the remaining time from the period associated with the clock signal after subtracting the associated flip-flop overhead time may be insufficient to perform the logic functions programmed into the logic.

Embodiments of the present disclosure may be directed to one or more of the problems set forth above.

BRIEF DESCRIPTION OF DRAWINGS

FIG. 2 is a block diagram of a command path of the memory device of FIG. 1, according to an embodiment of the present disclosure;

FIG. 4 is a block diagram of a system for increasing the time used to perform logic functions programmed into logic of the command path of FIG. 2 when a command is associated with an even number of shifts, according to an embodiment of the present disclosure;

FIG. 6 is a block diagram of a system for increasing the time used to perform logic functions programmed into logic of the command path of FIG. 2 when a command is associated with an odd number of shifts, according to an embodiment of the present disclosure;

FIG. 9 is a block diagram of a system for increasing the time used to perform logic functions programmed into logic in multiple command paths of FIG. 2, according to an embodiment of the present disclosure;

FIG. 10 is a block diagram of a system for increasing the time used to perform the logic functions programmed into the logic of the command path of FIG. 2 and generating an output command that has a duration that is equal to a period of an input clock signal, according to an embodiment of the present disclosure;

FIG. 11A is a block diagram of a system that facilitates transferring a command to an earlier clock domain, according to an embodiment of the present disclosure;

FIG. 11B is a block diagram of a slow clock signal, an intermediate clock signal, and a fast clock signal of the system of FIG. 11A using an external clock signal, according to an embodiment of the present disclosure; and FIG. 11C is a diagram of timing characteristics of the associated commands and clock signals of the system, according to an embodiment of the present disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, even and odd clock signals may be generated based on receiving an input clock signal (e.g., external to a command path). A received command and the even clock signal may be transmitted to a first command path. The command and the odd clock signal may also be transmitted to a second command path. The outputs of the first command path and the second command path may be shifted when the command is associated with an odd number of shifts. The outputs of the first command path and the second command path may be combined. In this manner, the remaining time from the period associated with the input clock signal after subtracting the associated flip-flop overhead time may be increased and thus be sufficient to perform the logic functions programmed into the logic.

Figure 1:
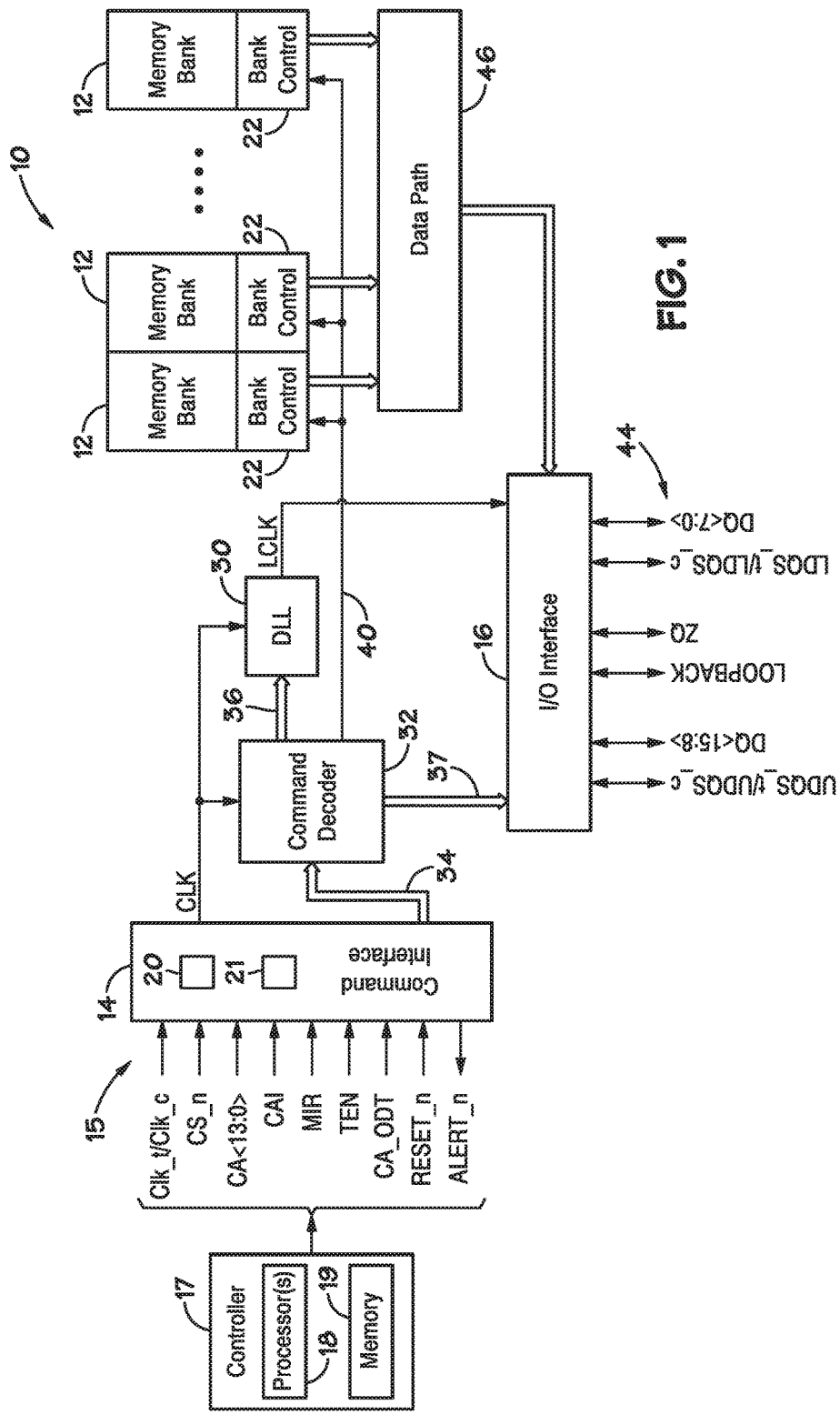
FIG. 1 is a simplified block diagram illustrating certain features of a memory device, according to an embodiment of the present disclosure.

Turning now to the figures, FIG. 1 is a simplified block diagram illustrating certain features of a semiconductor device (e.g., a memory device 10), according to an embodiment of the present disclosure. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM. While the present disclosure uses the memory device 10 as an example of a semiconductor device, it should be understood that embodiments of the present disclosure are envisioned to apply to any suitable semiconductor device, such as integrated circuits, transistors, processors, microprocessors, and the like.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a controller 17. The controller 17 may include processing circuitry, such as one or more processors 18 (e.g., one or more microprocessors), that may execute software programs to provide various signals 15 to the memory device 10 to facilitate the transmission and receipt of data to be written to or read from the memory device 10. Moreover, the processor(s) 18 may include multiple microprocessors, one or more "general-purpose" microprocessors, one or more special-purpose microprocessors, and/or one or more application specific integrated circuits (ASICS), or some combination thereof. For example, the processor(s) 18 may include one or more reduced instruction set (RISC) processors. The controller 17 may be coupled to one or more memories 19 that may store information such as control logic and/or software, look up tables, configuration data, etc. In some embodiments, the processor(s) 18 and/or the memory 19 may be external to the controller 17. The memory 19 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 19 may store a variety of information and may be used for various purposes. For example, the memory 19 may store machine-readable and/or processor-executable instructions (e.g., firmware or software) for the processor(s) 18 to execute, such as instructions for providing various signals 15 to the memory device 10 to facilitate the transmission and receipt of data to be written to or read from the memory device 10. As such, the controller 17 may provide various signals 15 to the memory device 10 to facilitate the transmission and receipt of data to be written to or read from the memory device 10.

As will be appreciated, the command interface 14 may include a number of circuits, such as a clock input circuit 20 and a command address input circuit 21, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 20 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The command decoder 32 may also provide command signals to the I/O interface 16 over bus 37 to facilitate receiving and transmitting I/O signals. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 21 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

With the foregoing in mind, FIG. 2 is a block diagram of a command path or pipeline 50 of the memory device 10 of FIG. 1, according to an embodiment of the present disclosure. The command path 50 of the memory device 10 may include any path or channel that transmits or receives a command in the memory device 10, such as the command bus 34, the bus 36, the bus 37, and/or the bus path 40. Moreover, the command path 50 may include any path or channel that transmits or receives a command in any components of the memory device 10, such as any path or channel that transmits or receives a command in the command interface 14, the command decoder 32, the DLL 30, the I/O interface 16, the bank controls 22, the memory banks 12, and the like. The command path 50 may include one or more logics or logic circuitries 52 coupled to one or more flip-flops 54. In some embodiments, as illustrated, the one or more logic circuitries 52 may be chained together using the one or more flip-flops 54. The command path 50 may receive a command 56 and a clock signal 58. The logic circuitries 52 (which may include a combination of different kinds of logic) may perform programmed instructions based on the command 56. The flip-flops 54 may shift the command 56 to, for example, resolve latency issues resulting from transmitting and/or receiving the command 56 in the memory device 10.

The clock signal 58 may be any suitable clock signal used to synchronize or maintain timing within the command path 50 with the memory device 10. For example, the clock signal 58 may be provided from a source external to the command path 50, such as a global clock signal (e.g., a clock signal that is global and accessible throughout the memory device 10). In response to the command 56, the command path 50 may generate an output command 60 that may be a result of the programmed instructions of the logic 52 and/or the shifting of the flip-flops 54.

Figure 3:
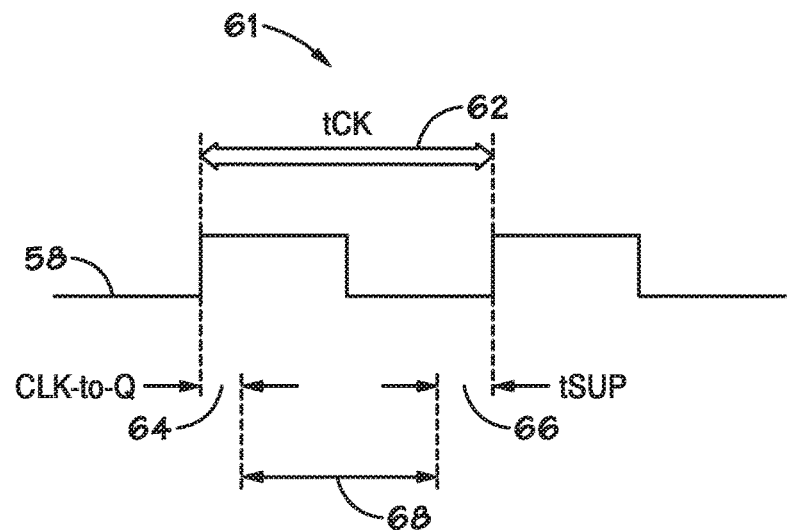
FIG. 3 is a diagram of timing characteristics of flip-flops of the command path of FIG. 2, according to an embodiment of the present disclosure.

FIG. 3 is a diagram of timing characteristics 61 of the flip-flops 54 of the command path 50 of FIG. 2, according to an embodiment of the present disclosure. The flip-flops 54, as well as other components of the command path 50, may typically operate at the frequency of the associated clock signal 58. In particular, tCK 62 represents a period of the clock signal 58 input to the flip-flops 54. There may be an overhead time associated with the flip-flops 54 used to receive and send the command 56. For example, the overhead time may include a CLK-to-Q 64 time, which may represent a time to output the output command 60 after settling to a steady state after an edge of the clock signal 58 has occurred. The overhead time of a period of the clock signal 58 may also include a tSUP 66 time, which may represent a time to setup the command 56 before an edge the clock signal 58 arrives. In the present embodiment, timing of the memory device 10 will be referred to based on a rising edge of the clock signal 58, though any suitable timing reference may be used, such as a falling edge of the clock signal 58.

The remaining time 68 in the tCK 62 may be used to perform the logic functions programmed into the logic 52. However, in some instances, the remaining time 68 may be insufficient to perform the logic functions programmed into the logic 52. This may be for a variety of reasons, such as lower voltage being supplied to the memory device 10 resulting in shorter tCK 62 of the clock signal 58, the logic functions being too extensive, and the like.

As an example, the tCK 62 of the clock signal 58 may be approximately 312.5 ps (picoseconds), there may be a flip-flop 54 in the command path 50, the CLK-to-Q 64 time for the flip-flop 54 may be approximately 180 ps, and the tSUP 66 time for the flip-flop 54 may be approximately 120 ps. As such, the remaining time 68 may be approximately 12.5 ps (i.e., 312.5 ps−(180 ps+120 ps)). In some cases, this may not be enough time to perform the logic functions programmed into the logic 52.

As such, it may be desirable to increase the time available to perform the logic functions programmed into the logic 52 after accounting for overhead time to provide sufficient time to perform the logic functions.

The present disclosure contemplates including internal command paths with an internally generated geared-down clock signal. For example, the geared-down clock signal may have a frequency that is half of the frequency of the received clock signal 58 (e.g., an external clock signal). In this manner, each flip-flop 54 may consume double the external clock signal 58 (i.e., 2×tCK 62), such that each flip-flop stage is a "double-step" with respect to the clock signal 58. Using the previous timing numbers as an example, the period of the geared-down clock signal may be twice that of tCK 62 (e.g., approximately 625 ps when the tCK 62 is 312.5 ps). In the previously discussed example, the flip-flop 54 in the command path 50 has a CLK-to-Q 64 time of approximately 180 ps and a tSUP 66 time of approximately 120 ps. Applying the geared-down clock embodiment to the foregoing example, the time to perform the logic functions programmed into the logic 52 using the internal command path with the geared-down clock signal may be approximately 225 ps (i.e., 625 ps−(180 ps+120 ps)). As such, the time used to perform the logic functions programmed into the logic 52 is increased without decreasing a frequency of the clock signal 58 through the command path 50, and may now be sufficient to perform those logic functions. As mentioned above, it may be undesirable to increase the frequency of the clock signal 58 because the logic 52 may not have sufficient time to perform the programmed logic functions, resulting in break down of the command path 50.

FIG. 4 is a block diagram of a system 70 for increasing the time available to perform the logic functions programmed into the logic 52 of the command path 50 of FIG. 2 when the command 56 is associated with an even number (e.g., L) of shifts (e.g., based on clock cycles of the external clock signal 58), according to an embodiment of the present disclosure. The even number (L) of shifts may be based on latency resulting from transmitting or receiving the command 56 throughout the memory device 10.

As illustrated, the clock signal 58 may be input to a clock divider 72, which may generate the internal geared-down half-frequency clock. In particular, the clock divider 72 may generate an even clock signal 74 and an odd clock signal 76, each of which have frequencies that are half the frequency of the clock signal 58. That is, the even clock signal 74 and the odd clock signal 76 may be complementary to each other in phase. The clock divider 72 may generate the even clock signal 74 and the odd clock signal 76 using pointers that identify the even and odd cycles of the clock signal 58. In other words, the frequency through the command path 50 or entire pipeline of the system 70 (other than components using the even clock signal 74 or the odd clock signal 76) is the external clock frequency of the clock signal 58, but the various logic 52 and the flip flops 54 using the even clock signal 74 or the odd clock signal 76 is half the external clock frequency of the clock signal 58.

Figure 5:
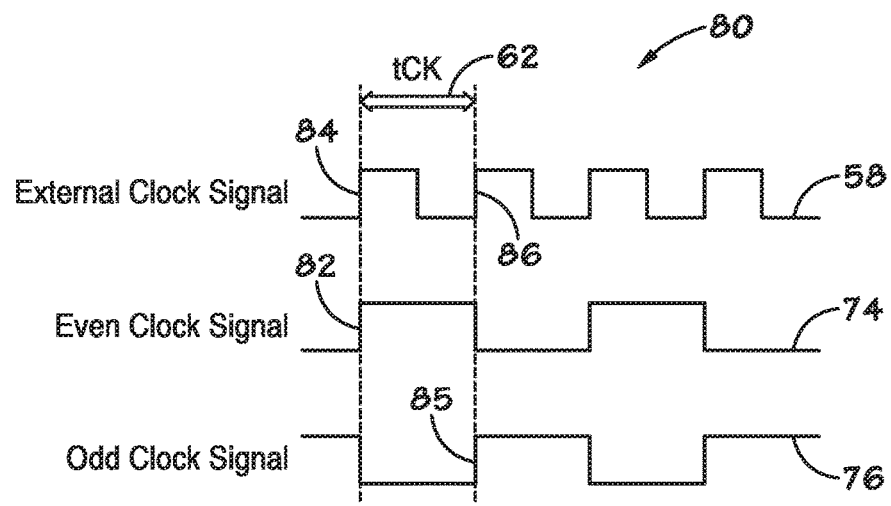
FIG. 5 is a diagram of timing characteristics of an external clock signal, an even clock signal, and an odd clock signal, according to an embodiment of the present disclosure.

FIG. 5 is a diagram of timing characteristics 80 of the external clock signal 58, the even clock signal 74, and the odd clock signal 76, according to an embodiment of the present disclosure. As illustrated, rising edges 82 of the even clock signal 74 may synchronize with alternating rising edges 84 of the clock signal 58. Similarly, rising edges 85 of the odd clock signal 76 may be synchronized with alternating rising edges 86 of the clock signal 58. However, in some embodiments, the rising edges 82 of the even clock signal 74 and the rising edges 85 of the odd clock signal 76 may not be synchronized.

Turning back to FIG. 4, an even command path 78 that includes logic 52 and a set of flip-flops 54 may receive the even clock signal 74. As used herein, the set of flip-flops 54 of the even command path 78 may include any suitable number of flip-flops 54, such as one or more flip-flops 54. The even command path 78 may perform instructions programmed into the logic 52 based on the even clock signal 74, which has a frequency that is half the frequency of the clock signal 58. Additionally, command splitting circuitry 79 (e.g., "a command splitter") may determine whether the external clock signal 58 is in phase with the even clock signal 74 (e.g., shares a rising edge with the even clock signal 74). If so, the command splitter 79 may send the command 56 (which is associated with the external clock signal 58) to the even command path 78. The command splitter 79 may include any suitable circuitry that determines whether a first clock signal (e.g., the external clock signal 58) is in phase with a second clock signal (e.g., the even clock signal 74), such as one or more counters, gates, and the like.

An odd command path 80 that includes logic 52 and a set of flip-flops 54 may receive the odd clock signal 76. As used herein, the set of flip-flops 54 of the odd command path 80 may include any suitable number of flip-flops 54, such as one or more flip-flops 54. The odd command path 80 may perform instructions programmed into the logic 52 based on the odd clock signal 76, which has a frequency that is half the frequency of the clock signal 58. The command splitter 79 may determine whether the external clock signal 58 is in phase with the odd clock signal 76. If so, the command splitter 79 may send the command 56 to the odd command path 80.

The number (L/2) of shifts performed by each of the even command path 78 and the odd command path 80 may be half that of the even number (L) of shifts associated with the command 56. As such, the number of flip-flops 54 in each of the even command path 78 and the odd command path 80 may be the number (L/2) of shifts to be performed.

Combination circuitry 87 may then combine an output (e.g., an even output signal 88) of the even command path 78 and an output (e.g., an odd output signal 89) of the odd command path 80 to generate a combination of the even output signal 88 and the odd output signal 89 to form the output command 60. The combination circuitry 87 may include any suitable components that enable combining the outputs of the even command path 78 and the odd command path 80, such as an OR gate. In particular, the combination circuitry 87 may use pointers (e.g., an even pointer and an odd pointer) that identify the even and odd cycles of the clock signal 58 to combine the even command path 78 and the odd command path 80 by associating the even command path 78 with the even pointer and associating the odd command path 80 with the odd pointer. Due to the even clock signal 74 and the odd clock signal 76 having periods double that of tCK 62, the output command 60 may have a duration (e.g., width) that is approximately double that of the period of the external clock signal 58 (i.e., 2×tCK 62).

In some embodiments, a first portion (e.g., the command 56) of a command packet associated with the external clock signal 58 may be sent to one of the command paths (e.g., the even command path 78) while a second portion of the command packet (e.g., information associated with the command 56) may be sent to the other command path (e.g., the odd command path 78). The command packet may then be reformed by combining the even output signal 88 and the odd output signal 89 to form the output command 60.

While the system 70 of FIG. 4 illustrates dividing the command path 50 into two command paths 78, 80 each with a frequency that is half that of the clock signal 58 of the command path 50, it should be understood that dividing the command path 50 into any suitable number n of command paths, each with a frequency that is 1/n, is contemplated.

In some instances, the command 56 may be associated with an odd number (e.g., L−1) of shifts. FIG. 6 is a block diagram of a system 90 for increasing the time used to perform the logic functions programmed into the logic 52 of the command path 50 of FIG. 2 when the command 56 is associated with an odd number of shifts (e.g., L−1), according to an embodiment of the present disclosure. The system 90 enables providing more available time for the logic 52 to perform appropriate logic functions without slowing throughput of the command path 50 or entire pipeline (e.g., reduce external clock speed). Instead of the even command path 78 and the odd command path 80 performing half (L/2) the even number (L) of shifts associated with the command 56 as shown in the system 70 of FIG. 4, the even command path 78 and the odd command path 80 in the system 90 performs an odd number (L−1) of shifts associated with the command 56. As such, the number of flip-flops 54 utilized in each of the even command path 78 and the odd command path 80 may be the number (L−1)/2 of shifts to be performed.

A first flip-flop 92 then receives the output of the even command path 78 and the odd clock signal 76, and a second flip-flop 94 receives the output of the odd command path 80 and the even clock signal 74. As a result, the first flip-flop 92 and the second flip-flop 94 each generate a shift that has a duration of approximately tCK 62 with a final shift of L since L=2×[(L−1)/2]+1. This single cycle shift enables an odd number of shifts corresponding to the command 56. The combination circuitry 87 may combine the outputs of the first flip-flop 92 and the second flip-flop 94 to generate the output command 60 that may have a duration (e.g., width) that is approximately double that of the period of the external clock signal 58 (i.e., 2×tCK 62).

Figure 7:
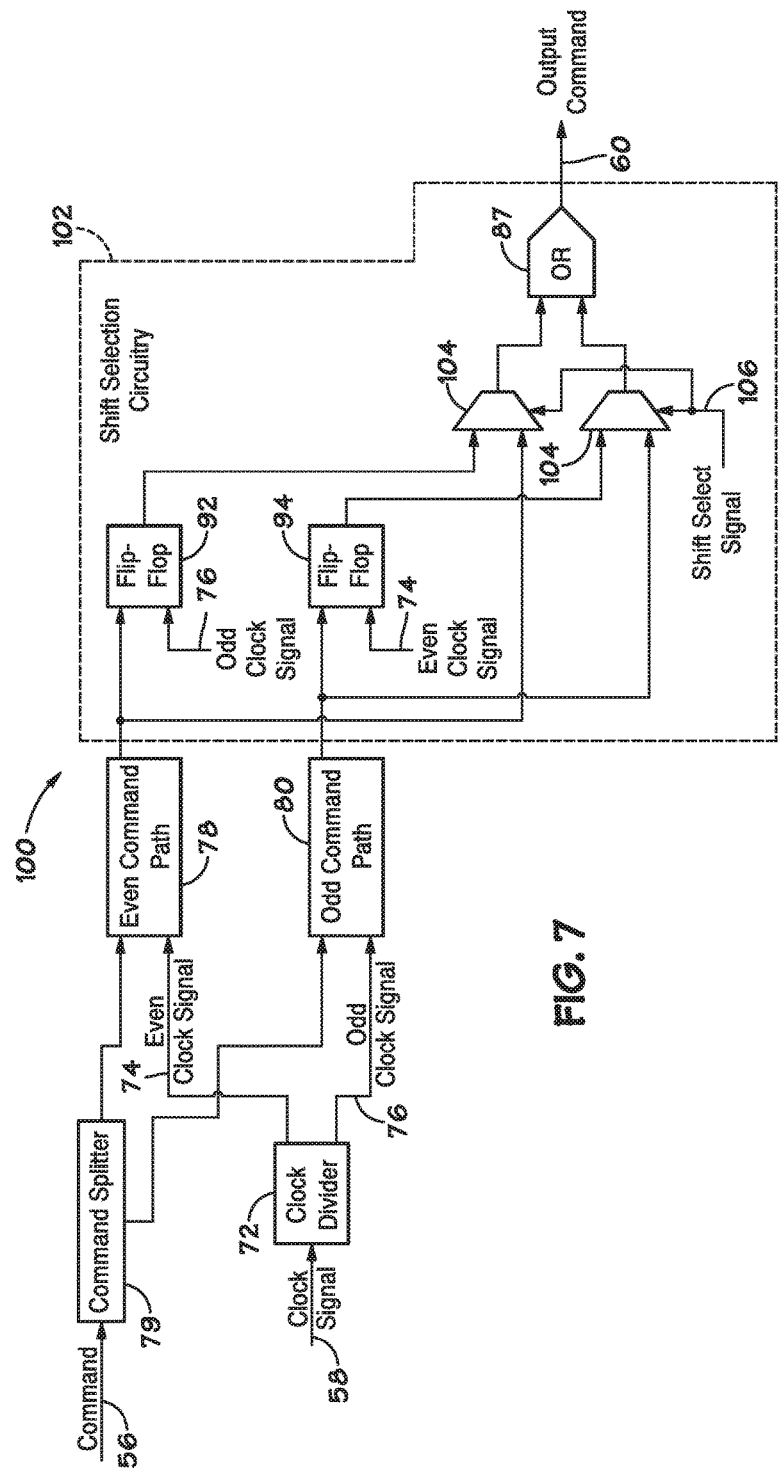
FIG. 7 is a block diagram of a system for increasing the time used to perform logic functions programmed into logic of the command path of FIG. 2, according to an embodiment of the present disclosure.

FIG. 7 is a block diagram of a system 100 for increasing the time used to perform the logic functions programmed into the logic 52 of the command path 50 of FIG. 2, according to an embodiment of the present disclosure. The system 100 is similar to the system 70 of FIG. 4 and the system 90 of FIG. 6, with the addition of the shift selection circuitry 102. The shift selection circuitry 102 may include the flip-flops 92, 94 of the system 90 of FIG. 6, and may also include multiplexers 104.

The multiplexers 104 may receive the outputs of the even command path 78, the odd command path 80, the first flip-flop 92, and the second flip-flop 94. The multiplexers 104 may also receive a shift selector signal 106 which may include information related to the number of shifts associated with the command 56, such as whether the number of shifts associated with the command 56 is even or odd. Based on the shift selector signal 106, the multiplexers 104 may select outputs of the even command path 78 and the odd command path 80 (e.g., corresponding to the command 56 when it is associated with an even number of shifts) or the outputs of the first flip-flop 92 and the second flip-flop 94 (e.g., corresponding to the command 56 when it is associated with an odd number of shifts). The combination circuitry 87 may then combine the selected outputs to generate the output command 60. In this manner, the system 100 may increase the time used to perform the logic functions programmed into the logic 52 of the command path 50 for commands 56 that are associated with either an even number or an odd number of shifts.

Figure 8:
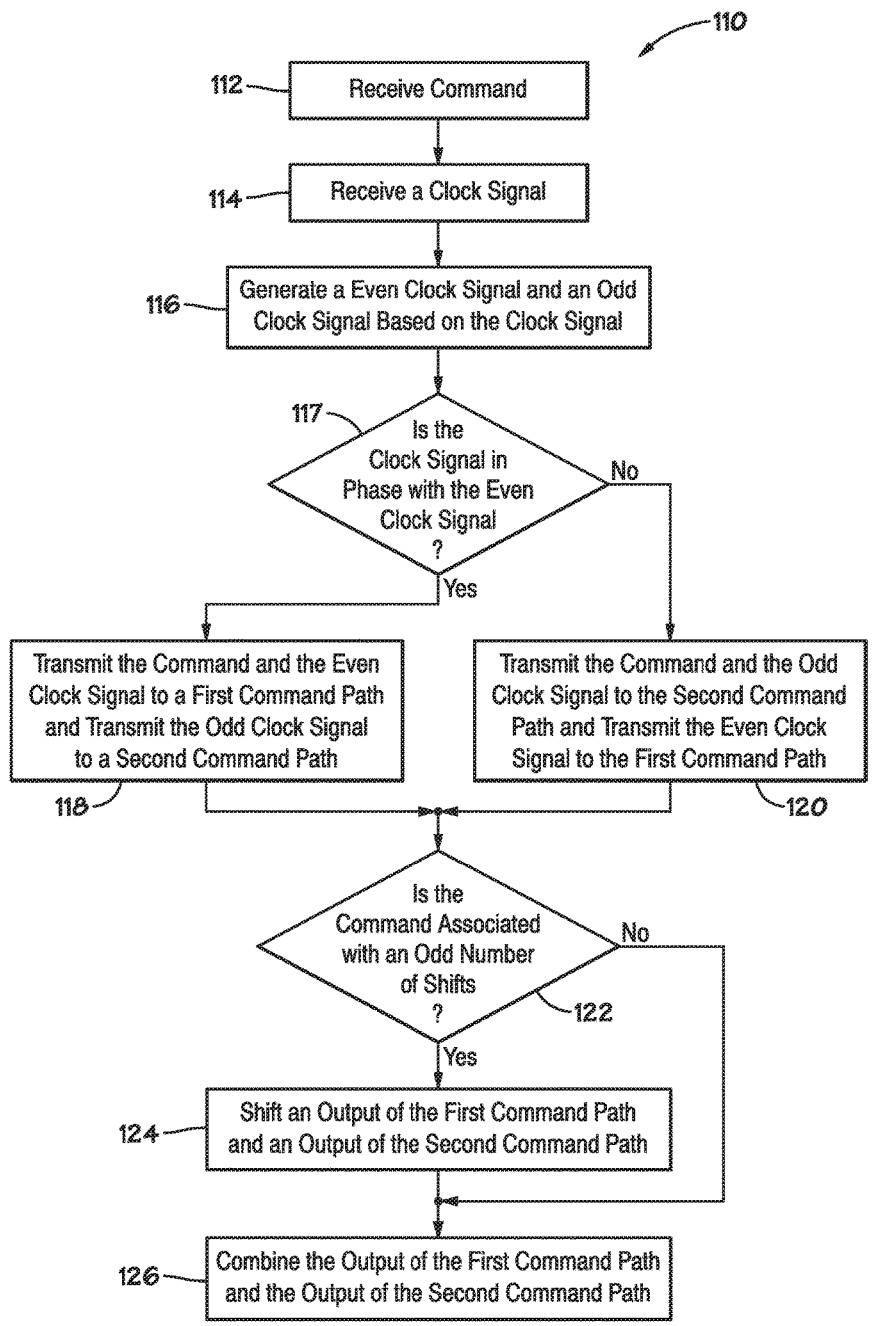
FIG. 8 is a flow diagram of a method for increasing the time used to perform the logic functions programmed into logic of the command path of FIG. 2 by dividing the command path into two half-frequency command paths, according to an embodiment of the present disclosure.

FIG. 8 is a flow diagram of a method 110 for increasing the time used to perform the logic functions programmed into the logic 52 of the command path 50 of FIG. 2 by dividing the command path 50 into two half-frequency command paths (e.g., 78, 80), according to an embodiment of the present disclosure. The method 110 may be performed by any suitable device or combination of devices that may generate even and odd clock signals based on receiving an input clock signal (e.g., external to a command path), transmit a received command and the even clock signal to a first command path and/or transmit the command and the odd clock signal a second command path, shift outputs of the first command path and the second command path when the command is associated with an odd number of shifts, and combine the outputs of the first command path and the second command path. While the method 110 is described using steps in a specific sequence, it should be understood that the present disclosure contemplates that the described steps may be performed in different sequences than the sequence illustrated, and certain described steps may be skipped or not performed altogether. In some embodiments, at least some of the steps of the method 110 may be performed by a controller (e.g., the controller 17) communicatively coupled to a semiconductor device (e.g., the memory device 10), the command interface 14, the command decoder 32, and/or any other suitable device. While the method 110 is described below as being performed by the command interface 14, it should be understood that any suitable device or combination of devices is contemplated to perform the method 110.

As illustrated, the command interface 14 receives (process block 112) the command 56. The command interface 14 also receives (process block 114) the clock signal 58 (e.g., external to the command path 50). The command interface 14 then generates (process block 116) the even clock signal 74 and the odd clock signal 76 based on the clock signal 58. In particular, the command interface 14 may instruct the clock divider 72 to generate the even clock signal 74 and the odd clock signal 76 based on the clock signal 58. Each of the even clock signal 74 and the odd clock signal 76 may have frequencies that are half the frequency of the clock signal 58. In some embodiments, the command interface 14 may generate the even clock signal 74 and the odd clock signal 76 based on pointers that identify the even and odd cycles of the clock signal 58. In particular, the rising edges 82 of the even clock signal 74 may synchronize with the alternating rising edges 84 of the clock signal 58, while the rising edges 85 of the odd clock signal 76 may synchronize with the alternating rising edges 86 of the clock signal 58. However, the rising edges 82 of the even clock signal 74 and the rising edges 85 of the odd clock signal 76 may not synchronize.

The command interface 14 determines (decision block 117) whether the external clock signal 58 is in phase with the even clock signal 74 (e.g., shares a rising edge with the even clock signal 74). In particular, the command interface 14 may instruct the command splitter 79 to determine whether the external clock signal 58 is in phase with the even clock signal 74. If so, then the command interface 14 transmits (process block 118) the command 56 (which is associated with the external clock signal 58) and the even clock signal 74 to a first command path (e.g., the even command path 78), and transmits the odd clock signal 76 to a second command path (e.g., the odd command path 80). The first and second command paths may each include logic 52 and flip-flops 54, and may perform instructions programmed into the logic 52 based on the even clock signal 74 and the odd clock signal 76, respectively.

If the command interface 14 determines that the external clock signal 58 is not in phase with the even clock signal 74 (e.g., because the external clock signal 58 is in phase with the odd clock signal 76), then the command interface 14 transmits (process block 120) the command 56 (which is associated with the external clock signal 58) and the odd clock signal 76 to the second command path (e.g., the odd command path 80), and transmits the even clock signal 74 to the first command path (e.g., the even command path 78). In some embodiments, the command interface 14 may transmit a first portion (e.g., the command 56) of a command packet associated with the external clock signal 58 to one of the command paths (e.g., the second command path) and transmit a second portion of the command packet (e.g., information associated with the command 56) to the other command path (e.g., the first command path).

The command interface 14 then determines (decision block 122) whether the command 56 is associated with an odd number of shifts. That is, the command 56 may be associated with a number of shifts (e.g., based on clock cycles of the external clock signal 58). The number of shifts may be even or odd, and may be based on latency resulting from transmitting or receiving the command 56 throughout the memory device 10. Alternatively, the command interface 14 may determine whether the command 56 is associated with an even number of shifts. In some embodiments, the command interface 14 may determine whether the command 56 is associated with an odd or even number of shifts based on receiving the shift selector signal 106, which may include information related to the number of shifts associated with the command 56, such as whether the number of shifts associated with the command 56 is even or odd.

If the command interface 14 determines that the command 56 is associated with an odd number of shifts, the command interface 14 shifts (process block 124) an output of the first command path and an output of the second command path. For example, the command interface 14 may send the output of the first command path and the odd clock signal 76 to the first flip-flop 92, and the output of the second command path and the even clock signal 74 to the second flip-flop 94. The first flip-flop 92 and the second flip-flop 94 may each generate a shift that has a duration approximately of the period of the clock signal 58 (e.g., tCK 62). This single cycle shift enables an odd number of shifts corresponding to the command 56.

Regardless of whether the number of shifts is even or odd, the command interface 14 combines (process block 126) the output of the first command path and the second command path to generate the output command 60. In particular, the command interface 14 may use the combination circuitry 87 to combine the outputs of the first command path and the second command path. In this manner, the method 110 may increase the time used to perform the logic functions programmed into the logic 52 of the command path 50 without decreasing throughput of the system 10.

In some circumstances, when a command 56 is to be sent through more than one command path 50 of the memory device 10, it may be more efficient to chain the command paths 50 together and output the output command 60 from the last command path 50 in the chain to the shift selection circuitry 102, rather than sending an output of intermediate shift selection circuitries 102 (e.g., separating the command paths 50) to a subsequent command path 50. FIG. 9 is a block diagram of a system 140 for increasing the time used to perform the logic functions programmed into the logic 52 in multiple command paths 50 of FIG. 2, according to an embodiment of the present disclosure. The system 140 is similar to the system 100 of FIG. 7, with the addition of a second even command path 142 and a second odd command path 144. In particular, the output of the even command path 78 (e.g., the even output signal 88) is input to the second even command path 142, and the output of odd command path 80 (e.g., the odd output signal 89) is input to the second odd command path 144. The outputs 146, 148 of the second even command path 142 and the second odd command path 144 are then input to the shift selection circuitry 102. While the two even command paths 78, 142 and two odd command paths 80, 144 are shown in the system 140 of FIG. 9, it should be understood that any suitable number of multiple even command paths and odd command paths are contemplated.

As mentioned above, the output command 60 generated by the combination circuitry 87 of, for example, the system 70 of FIG. 4, the system 90 of FIG. 6, and the system 100 of FIG. 7, may have a duration (e.g., width) that is approximately double that of the period of the external clock signal 58 (i.e., 2×tCK 62). In some circumstances, it may be desired to generate a output command 60 that has a duration that is approximately equal to the period of external clock signal 58 (i.e., tCK 62). FIG. 10 is a block diagram of a system 160 for increasing the time used to perform the logic functions programmed into the logic 52 of the command path 50 of FIG. 2 and generating a output command 60 that has a duration that is approximately equal to the period of the input clock signal 58, according to an embodiment of the present disclosure using latches. The system 160 is similar to the system 100 of FIG. 7, except that the shift selection circuitry 102 is replaced with a first latch 162, a second latch 164, first AND logic 166, second AND logic 168, and the combination circuitry 87.

In particular, the output of the even command path 78 and the even clock signal 74 is transmitted to the first latch 162. Similarly, the output of the odd command path 80 and the odd clock signal 76 is transmitted to the second latch 164. The first latch 162 and the first AND logic 166 (e.g., first gating logic 170) may be configured to gate the even command path 78 based on the even clock signal 74 and the second latch 164 and the second AND logic 168 (e.g., second gating logic 172) may be configured to gate the odd command path 80 based on the odd clock signal 76. That is, the first gating logic 170 may hold the even command path 78 from an active (e.g., rising) edge of the even clock signal 74 until an inactive (e.g., falling) edge of the even clock signal 74. Similarly, the second gating logic 172 may hold the odd command path 80 from an active (e.g., rising) edge of the odd clock signal 76 until an inactive (e.g., falling) edge of the odd clock signal 76. As a result, the output command 60 generated by the combination circuitry 87 receiving the output of the first gating logic 170 and the output of the second gating logic 172 may have a duration (e.g., width) that is approximately equal to the period of the input clock signal 58 (i.e., tCK 62).

In some circumstances, the command 56 may be received from a "delayed" clock domain, and it may be desirable to transfer the command 56 to an "earlier" clock domain. That is, it may be desirable to move the command 56 to an earlier clock phase than where it currently resides. Advantageously, because the frequency of the even command path 78 and the odd command path 80 are half that of the external clock signal 58, each "step" that the command 56 may be transferred "back" is double that of a step that the external clock is capable of stepping back.

FIG. 11A is a block diagram of a system 180 that facilitates transferring the command 56 to an earlier clock domain, according to an embodiment of the present disclosure. The system 180 may be included in, for example, the even command path 78 and the odd command path 80, to transfer the command 56 to an earlier clock domain. The system 180 may include inputting a command (0) 56 (that is associated or clocked with the external clock signal 58) and a "slow" clock signal 182 to a first flip-flop 184, which may output a command (1) 186. The command (1) 186 (that is associated or clocked with the slow clock signal 182) and an "intermediate" clock signal 188 may then be input to a second flip-flop 190, which may output a command (2) 192. The command (2) 192 (that is associated or clocked with the intermediate clock signal 188) and a "fast" clock signal 194 may then be input to a third flip-flop 196, which may output a command (3) 199.

FIG. 11B is a block diagram 210 of generating the slow clock signal 182, the intermediate clock signal 188, and the fast clock signal 194 of the system 180 using the external clock signal 58, according to an embodiment of the present disclosure. The external clock signal 58 may be input to a delay block or circuitry 211. The fast clock signal 194 may be output from the delay block 211. The fast clock signal 194 may then be input to another delay block or circuitry 212. The intermediate clock signal 188 may be output from the delay block 212. The intermediate clock signal 188 may then be input to yet another delay block or circuitry 214. The slow clock signal 182 may be output from the delay block 214. The delay blocks or circuitries 211, 212, 214 may include any suitable components to cause delay in the clock signals, such as one or more buffers, gates, and the like.

As such, it should be understood that the fast clock signal 194, the intermediate clock signal 188, and the slow clock signal 182 are each delayed (e.g., include a rising edge that occurs after a corresponding rising edge of the external clock signal 58) when compared to the external clock signal 58. Moreover, the intermediate clock signal 188 is delayed (e.g., includes a rising edge that occurs after a corresponding rising edge of the fast clock signal 194) when compared to the fast clock signal 194. Similarly, the slow clock signal 182 is delayed (e.g., includes a rising edge that occurs after a corresponding rising edge of the intermediate clock signal 188) when compared to the intermediate clock signal 188. For example, each of the delay blocks 211, 212, 214 may cause a delay of 300 ps. As such, if a rising edge of the external clock signal 58 occurs at 0 ps, a corresponding rising edge of the fast clock signal 194 may occur at 300 ps, a corresponding rising edge of the intermediate clock signal 188 may occur at 600 ps, and a corresponding rising edge of the slow clock signal 182 may occur at 900 ps.

FIG. 11C is a diagram of timing characteristics 220 of the associated commands and clock signals of the system 180, according to an embodiment of the present disclosure. As illustrated, the command (0) 56 may be captured at an $N+1^{st}$ rising edge 222 of the slow clock signal 182, which is associated with a delayed clock domain. The command (1) 186 may be captured at an $N+2^{nd}$ rising edge 224 of the intermediate clock signal 188, which is associated with a clock domain that is earlier than the delayed clock domain associated with the slow clock signal 182. The command (2) 192 is captured at an $N+3^{rd}$ rising edge 226 of the fast clock signal 194, which is associated with a clock domain that is earlier than the clock domain associated with the intermediate clock signal 188. In this manner, the command (0) 56 may be received from a delayed clock domain and transferred to an earlier clock domain (e.g., as the command (2) 192). While FIGS. 11A-11C illustrate transferring the command 56 from a delayed clock domain to a clock domain that is earlier (associated with the fast clock signal 194) using an intermediate clock domain (associated with the intermediate clock signal 188), it should be understood that transferring the command 56 to any suitable clock domain earlier than the delayed clock domain using any number of intermediate clock domains and intermediate clock signals (e.g., 0 to 1000) is contemplated (e.g., by using a number of flip-flops 184, 190, 196 corresponding to a time difference between the delayed clock domain and the earlier clock domain).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:
   a clock divider configured to receive a clock signal and generate an even clock signal and an odd clock signal, wherein the clock signal comprises a first frequency, wherein the even clock signal and the odd clock signal each comprises a second frequency that is half the first frequency;
   an even command path coupled to the clock divider comprising a first set of logic and a first set of flip-flops, wherein the even command path is configured to receive a command and the even clock signal and output an even output signal;
   an odd command path coupled to the clock divider comprising a second set of logic and a second set of flip-flops, wherein the odd command path is configured to receive the command and the odd clock signal and output an odd output signal; and
   shift selection circuitry configured to enable shifting the even output signal if the command is associated with an even number of shifts and shifting the odd output signal if the command is associated with an odd number of shifts, wherein the shift selection circuitry comprises combination circuitry, wherein the combination circuitry is coupled to the even command path and odd command path and configured to combine the even output signal and the odd output signal.

2. The semiconductor device of claim 1, comprising command splitting circuitry configured to transmit the command and the even clock signal to the even command path when the clock signal and the even clock signal are in phase, and transmit the command and the odd clock signal to the odd command path when the clock signal and the odd clock signal are in phase.

3. The semiconductor device of claim 1, wherein the combination circuitry comprises at least an OR gate configured to receive as inputs the even output signal and the odd output signal and output an output command signal.

4. The semiconductor device of claim 1, wherein the combination circuitry generates an output command based at least in part on combining the even output signal and the odd output signal, wherein a duration of the output command is approximately equal to two times a period of the clock signal.

5. The semiconductor device of claim 1, comprising:
   a first gating logic coupled to the even command path, wherein the first gating logic is configured to gate the even clock signal; and
   a second gating logic coupled to the odd command path, wherein the second gating logic is configured to gate the odd clock signal.

6. The semiconductor device of claim 5, comprising:
   a first AND gate coupled to the even command path and the combination circuitry, wherein the first AND gate is configured to receive an output of the first gating logic and the even clock signal; and
   a second AND gate coupled to the odd command path and the combination circuitry, wherein the second AND gate is configured to receive an output of the second gating logic and the odd clock signal.

7. The semiconductor device of claim 6, wherein the combination circuitry is coupled to an output of the first AND gate and an output of the second AND gate and configured to generate an output command based at least in part on the output of the first AND gate and the output of the second AND gate.

8. The semiconductor device of claim 7, wherein a duration of the output command is approximately equal to a period of the clock signal.

9. A system comprising:
   a controller configured to provide a command and a clock signal comprising a first frequency; and
   a command path coupled to the controller and configured to receive the command and the clock signal, comprising:
      a clock divider configured to generate an even clock signal and an odd clock signal based on the clock signal, wherein the even clock signal and the odd clock signal each comprises a second frequency that is half the first frequency;
      clock splitting circuitry configured to:
         when the clock signal and the even clock signal are in phase:
            output the command and the even clock signal to an even command path; and
            output the odd clock signal to an odd command path; and
         when the clock signal and the odd clock signal are in phase:
            output the command and the odd clock signal to the odd command path; and
            output the even clock signal to the even command path;
      the even command path coupled to the clock divider comprising a first set of logic and a first set of flip-flops, wherein the even command path is configured to output an even output signal based at least in part on receiving an output of the clock splitting circuitry;
      the odd command path coupled to the clock divider comprising a second set of logic and a second set of flip-flops, wherein the odd command path is configured to output an odd output signal based at least in part on receiving the output of the clock splitting circuitry;
      shift selection circuitry coupled to the even command path and the odd command path and configured to generate an output command based at least in part on the even output signal and the odd output signal;
      a second even command path coupled to the even command path comprising a third set of logic and a third set of flip-flops, wherein the second even command path is configured to output a second even output signal based at least in part on the even output signal and the even clock signal;
      a second odd command path coupled to the odd command path comprising a fourth set of logic and a fourth set of flip-flops, wherein the second odd command path is configured to output a second odd output signal based at least in part on the odd output signal and the odd clock signal; and second shift selection circuitry coupled to the second even command path and the second odd command path and configured to generate a second output command based at least in part on the second even output signal and the second odd output signal.

10. The system of claim 9, wherein the shift selection circuitry is configured to shift the even output signal and shift the odd output signal if the command is associated with an odd number of shifts.

11. The system of claim 10, wherein the shift selection circuitry comprises:

a first flip-flop coupled to the even command path configured to shift the even output signal if the command is associated with an odd number of shifts; and a second flip-flop coupled to the odd command path configured to shift the odd output signal if the command is associated with the odd number of shifts.

12. The system of claim 11, wherein:

the first flip-flop is configured to not shift the even output signal if the command is not associated with the odd number of shifts; and the second flip-flop is not configured to not shift the odd output signal if the command is not associated with the odd number of shifts.

13. The system of claim 12, wherein the shift selection circuitry is configured to receive a shift selector signal comprising information related to a number of shifts associated with the command.

14. The system of claim 13, wherein the shift selection circuitry comprises one or more multiplexers configured to:

receive the shift selector signal, the even output signal, an output of the first flip-flop, the odd output signal, and an output of the second flip-flop; and select the even output signal and the odd output signal, or the output of the first flip-flop and the output of the second flip-flop, based on the shift selector signal.

15. The system of claim 14, wherein the shift selection circuitry comprises combination circuitry configured to combine the even output signal and the odd output signal, or the output of the first flip-flop and the output of the second flip-flop, based on the shift selector signal.

16. An apparatus comprising:

a clock divider configured to receive a clock signal and generate a first clock signal and a second clock signal, wherein the first and second clock signals are complementary to each other in phase;

a first command path coupled to the clock divider and configured to transfer a command responsive to the first clock signal;

a second command path coupled to the clock divider configured to transfer the command responsive to the second clock signal; and shift selection circuitry configured to enable shifting the first clock signal if the command is associated with an even number of shifts and shifting the second clock signal if the command is associated with an odd number of shifts, wherein the shift selection circuitry comprises combination circuitry, wherein the combination circuitry is coupled to the first command path and second command path and configured to combine outputs of the first and second command path.

* * * * *